US006965331B2

(12) United States Patent
Demartini et al.

(10) Patent No.: US 6,965,331 B2
(45) Date of Patent: Nov. 15, 2005

(54) CONVERSION ARRANGEMENT AND METHOD FOR CONVERTING A THERMOMETER CODE

(75) Inventors: Paola Demartini, Sattendorf (AT); Michael Staber, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/774,292

(22) Filed: Feb. 6, 2004

(65) Prior Publication Data

US 2004/0222906 A1 Nov. 11, 2004

(30) Foreign Application Priority Data

Feb. 6, 2003 (DE) ........................................ 103 04 872

(51) Int. Cl.[7] ................................................ H03M 7/14
(52) U.S. Cl. .......................................... 341/96; 341/97
(58) Field of Search ................................ 341/341, 145, 341/118, 120, 96, 97, 156, 159, 160, 102, 103, 144, 153, 150, 154, 98; 307/455; 11/494; 326/43; 327/561; 704/504

(56) References Cited

U.S. PATENT DOCUMENTS 4,733,220 A * 3/1988 Knierim ...................... 341/64
5,459,466 A * 10/1995 Knierim et al. ............. 341/160
5,640,162 A * 6/1997 Lewyn ....................... 341/144
6,771,199 B2 * 8/2004 Brooks et al. .............. 341/143

FOREIGN PATENT DOCUMENTS

EP 0 221 238 A2 7/1986

* cited by examiner

*Primary Examiner*—Brian Young
(74) *Attorney, Agent, or Firm*—Maginot, Moore & Beck

(57) ABSTRACT

The invention relates to an arrangement for converting a binary input signal corresponding to an n-bit thermometer code into a binary output code different therefrom, having a first number of OR gate circuits, into the inputs of which bits of the thermometer code can be coupled, having a first adder, which is connected downstream of the OR gate circuits and into the inputs of which the output signals of the OR gate circuits can be coupled and which provides at least one binary output signal for the output code at its outputs, having a second number of multiplexer circuits, into the inputs of which bits of the thermometer code can be coupled and into the multiplexer selection terminals of which the output signals of the first adder can be coupled, having a second adder, which is connected downstream of the multiplexer circuits and into the inputs of which the output signals of the multiplexer circuits can be coupled and which provides at least one further binary output signal for the output code at its outputs.

The invention furthermore relates to a conversion method.

20 Claims, 4 Drawing Sheets

FIG 1

| segment 16-bit thermometer code | | | | binary output code | | decimal code | segment number of the segmented thermometer code |
|---|---|---|---|---|---|---|---|
| segment number | | | | | | | |
| p=3 | p=2 | p=1 | p=0 | | | | p |
| MSB (MSS) | | (LSS) LSB | | MSB | LSB | | |
| 0000 | 0000 | 0000 | 0001 | 00 | 00 | 0 | 00 (0) |
| 0000 | 0000 | 0000 | 0011 | 00 | 01 | 1 | |
| 0000 | 0000 | 0000 | 0111 | 00 | 10 | 2 | |
| 0000 | 0000 | 0000 | 1111 | 00 | 11 | 3 | |
| | | | | | | | |
| 0000 | 0000 | 0001 | 1111 | 01 | 00 | 4 | 01 (1) |
| 0000 | 0000 | 0011 | 1111 | 01 | 01 | 5 | |
| 0000 | 0000 | 0111 | 1111 | 01 | 10 | 6 | |
| 0000 | 0000 | 1111 | 1111 | 01 | 11 | 7 | |
| | | | | | | | |
| 0000 | 0001 | 1111 | 1111 | 10 | 00 | 8 | 10 (2) |
| 0000 | 0011 | 1111 | 1111 | 10 | 01 | 9 | |
| 0000 | 0111 | 1111 | 1111 | 10 | 10 | 10 | |
| 0000 | 1111 | 1111 | 1111 | 10 | 11 | 11 | |
| | | | | | | | |
| 0001 | 1111 | 1111 | 1111 | 11 | 00 | 12 | 11 (3) |
| 0011 | 1111 | 1111 | 1111 | 11 | 01 | 13 | |
| 0111 | 1111 | 1111 | 1111 | 11 | 10 | 14 | |
| 1111 | 1111 | 1111 | 1111 | 11 | 11 | 15 | |

FIG 3

| segmented 16-bit thermometer code | determined value of the decimal code | correct value of the decimal code | segment number of the segmented thermometer code |
|---|---|---|---|
| segment number<br>p=3 p=2 p=1 p=0 | | | p |
| MSB (MSS) (LSS) LSB | MSB LSB | | |
| 0000 0000 0000 0001 | 0 | 0 | 00 (0) |
| 0000 0000 0000 0010 | 1 | 1 | |
| 0000 0000 0000 0101 | 1 | 2 | |
| 0000 0000 0000 1011 | 2 | 3 | |
| | | | |
| 0000 0000 0001 0111 | 4 | 4 | 01 (1) |
| 0000 0000 0010 1111 | 5 | 5 | |
| 0000 0000 0101 1111 | 5 | 6 | |
| 0000 0000 1011 1111 | 6 | 7 | |
| | | | |
| 0000 0001 0111 1111 | 8 | 8 | 10 (2) |
| 0000 0010 1111 1111 | 9 | 9 | |
| 0000 0101 1111 1111 | 9 | 10 | |
| 0000 1011 1111 1111 | 10 | 11 | |
| | | | |
| 0001 0111 1111 1111 | 12 | 12 | 11 (3) |
| 0010 1111 1111 1111 | 13 | 13 | |
| 0101 1111 1111 1111 | 13 | 14 | |
| 1011 1111 1111 1111 | 14 | 15 | |

CONVERSION ARRANGEMENT AND METHOD FOR CONVERTING A THERMOMETER CODE

FIELD OF THE INVENTION

The invention relates to a conversion arrangement and a method for converting a binary input signal corresponding to an n-bit thermometer code into a binary output code different therefrom.

EP 0 221 238 A2 describes a thermometer-to-binary coder in which the thermometer code to be converted is divided into J subgroups each of K bits and each subgroup by itself is converted into a binary code. In this case, the individual thermometer-to-binary coder for each subgroup is constructed for example from a first number of AND gates and subsequent second number of OR gates. The binary output codes of the individual thermometer-to-binary coders for each subgroup are summed in an addition stage and the final binary output cod having a width of 7 bits is thus generated.

BACKGROUND

The thermometer code is a digital code which ideally consists of a series of binary ones followed by a series of binary zeros, or visa versa. The thermometer code thus ideally contains no zeroes in the series of ones, and visa versa. A thermometer code is very often used in analog-to-digital converters in order to convert an analog input signal, for example a measured voltage, into a digitally coded output signal.

Table 1 presented below shows a detailed representation of an n-bit thermometer code, where n denotes a positive integer with $n \geqq 2$. In the example in Table 1 $n=16$. The code accordingly consists of $n-1=15$ digital signals. Including the case in which only zeros and only ones occur, n permutations thus exist for the n-bit thermometer code. An arbitrary bit of the number of bits D1 to D15 is designated as DI, where I is a consecutive integer. In the case of an arbitrary value of P in the digital range of P=0 to P=15, each bit DI has a logic "zero" if I>P and each bit DI is a logic "one", if $I \leqq P$. This functional relationship explains the concept that the extent of the series of ones increases by one each time when P increases by one. P thus represents the digital equivalent of the analog input signal, for example of the analog input voltage, that is to say P corresponds to the decimal value which, after the conversion by the corresponding analog-to-digital converter, is intended to be provided at its output.

TABLE 1

| | 16-bit thermometer code | Binary output code | Decimal value of the thermometer code |
|---|---|---|---|
| P | D15............................D1 | | |
| <0 | 000000000000000 | 0000 | 0 |
| 0 | 000000000000000 | 0000 | 0 |
| 1 | 000000000000001 | 0001 | 1 |
| 2 | 000000000000011 | 0010 | 2 |
| 3 | 000000000000111 | 0011 | 3 |
| 4 | 000000000001111 | 0100 | 4 |
| 5 | 000000000011111 | 0101 | 5 |
| 6 | 000000000111111 | 0110 | 6 |
| 7 | 000000001111111 | 0111 | 7 |
| 8 | 000000011111111 | 1000 | 8 |
| 9 | 000000111111111 | 1001 | 9 |

TABLE 1-continued

| | 16-bit thermometer code | Binary output code | Decimal value of the thermometer code |
|---|---|---|---|
| 10 | 000001111111111 | 1010 | 10 |
| 11 | 000011111111111 | 1011 | 11 |
| 12 | 000111111111111 | 1100 | 12 |
| 13 | 001111111111111 | 1101 | 13 |
| 14 | 011111111111111 | 1110 | 14 |
| 15 | 111111111111111 | 1111 | 15 |
| >15 | 111111111111111 | 1111 | 15 |

Besides the column with the 16-bit thermometer code, a further column is specified which represents the 4-bit binary code which is intended to be generated in the event of a conversion ideally from the thermometer code.

Converting a thermometer code into a binary code requires a conversion circuit, as is presented for example in the European patent EP 632 598 B1.

Accordingly, in order to convert a thermometer code into a binary code, the individual bits of the thermometer code which are present at a respective output of a comparator are fed to a counter device, which successively counts the output bits of the comparators in the bit sequence of the thermometer code and thereby generates the thermometer code.

Said counter device becomes extraordinarily extensive in particular for those applications in which a thermometer code having a large number of bits, for example a 16-bit or 32-bit thermometer code, is intended to be converted into a binary code. An added difficulty is that, in this case, the conversion of the thermometer code into the binary code takes a very long time on account of the successive counting of the different thermometer code bits. Such a conversion circuit thus cannot be used at all, or can only be used to a limited extent, for high-frequency applications.

The abovementioned comparators which provide the thermometer code on the output side have a data input, into which an analog signal of an output stage is in each case coupled. The second comparator input is typically connected to a reference voltage source via which a reference potential can be fed to a comparator. The comparators in each case provide a digital output signal at their outputs in a manner dependent on the comparison of the analog input signal with the reference signal. If the input signal exceeds the value of the reference potential, then a logic "one" is typically present at the output, whereas for the case where the input signal is less than the reference potential, a logic "zero" is present at the output.

An operation for measurement of an analog signal value thus typically produces a thermometric digital signal whose successive bits have at most a single transition between a group of successive bits having the value "one" and a residual group of successive bits having the value "zero".

TABLE 2

| 16-bit thermometer code | Determined value of the decimal code | Correct value of the decimal code |
|---|---|---|
| 000000000000000 | 0 | 0 |
| 000000000000001 | 1 | 1 |
| 000000000000010 | 1 | 2 |
| 000000000000101 | 2 | 3 |
| 000000000001011 | 3 | 4 |

TABLE 2-continued

| 16-bit thermometer code | Determined value of the decimal code | Correct value of the decimal code |
|---|---|---|
| 0000000000010111 | 4 | 5 |
| 0000000000101111 | 5 | 6 |
| 0000000001011111 | 6 | 7 |
| 0000000010111111 | 7 | 8 |
| 0000000101111111 | 8 | 9 |
| 0000001011111111 | 9 | 10 |
| 0000010111111111 | 10 | 11 |
| 0000101111111111 | 11 | 12 |
| 0001011111111111 | 12 | 13 |
| 0010111111111111 | 13 | 14 |
| 0101111111111111 | 14 | 15 |

A further problem now consists in the fact that, on account of an erroneous comparison in the comparator stage, occasionally a "one" mistakenly passes into the series of zeros, or visa versa. This type of error is extremely rare and is referred to below as transition bit error since there is at least one additional transition between zeros and ones. In the literature, this type of error is often also referred to as decision error or "bubbles".

Table 2 above shows an example of a 16-bit thermometer code having transition bit errors. Besides the column with the decimal value of the measured signal, table 2 shows a further column with the decimal value which is output on account of the transition bit error. A transition bit error normally occurs near the region in which the code has its intended transitions between zeros and ones. In order to eliminate such errors caused by transition bit errors, conversion circuits are often equipped with a correction circuit, as are described for example in the document EP 632 598 B1 already cited.

The disadvantage of such error eliminating circuits consists primarily in the fact that this necessitates a further circuitry outlay for eliminating errors in addition to the considerable circuitry outlay for the converter. However, the additional circuitry outlay required for this is in turn detrimental to the performance, in this case in particular the rapidity, of the conversion circuit, so that such conversion circuits are only suitable for converting thermometer codes having a low number of bits.

SUMMARY

Therefore, the present invention is based on the object of providing a fastest possible conversion arrangement and a fastest possible conversion method for converting a thermometer code into a binary code. A further object of the invention is to provide a simplified arrangement in comparison with conventional converters.

These objects are achieved according to the invention by means of a converter arrangement having the features of Patent claim 1 and a method having the features of Patent claim 13.

Accordingly, provision is made of:

A converter arrangement for converting a binary input signal corresponding to an n-bit thermometer code into a binary output code different therefrom, having a first number of OR gate circuits, into the inputs of which bits of the thermometer code can be coupled, having a first adder, which is connected downstream of the OR gate circuits and into the inputs of which the output signals of the OR gate circuits can be coupled and which provides at least one binary output signal for the output code at its outputs, having a second number of multiplexer circuits, into the inputs of which bits of the thermometer code can be coupled and into the multiplexer selection terminals of which the output signals of the first adder can be coupled, having a second adder, which is connected downstream of the multiplexer circuits and into the inputs of which the output signals of the multiplexer circuits can be coupled and which provides at least one further binary output signal for the output code at its outputs. (Patent claim 1)

A method for converting a binary input signal corresponding to a thermometer code into a binary output code different therefrom, having the following method steps:

(a) an n-bit thermometer code is provided;

(b) the n-bit thermometer code is subdivided into m segments;

(c) the bits of at least the m−1 more significant segments are in each case ORed;

(d) the at least m−1 output signals from the ORing are added up, the binary result from this addition forming a first, more significant part of the output code;

(e) bits of different segments, which, however, have the same MSB or LSB significance within the respective segment, are multiplexed with one another, the first part of the output code being used as multiplex selection signal;

(f) the multiplexed output signals are added up, the binary result from this addition forming a second, less significant part of the output code. (Patent claim 13)

The heart of the present invention consists in a matrix which has different thermometer codes with an ascending code value in each case being subdivided into so-called segments in each case in the horizontal and also vertical projection. The individual segments have the same number of bits in this case. By means of the invention's highly advantageous combination of individual bits from the matrix that is subdivided into segments in this way and subsequent addition from the result of this logic combination, the corresponding binary output code can be provided in a very simple and also very effective and rapid manner.

In this case, the present invention is based on the insight that the thermometer code in principle has a highly regular structure—in contrast to a conventional binary code. Therefore, the desired output signals can be provided very rapidly by means of simple ORings, adders and multiplexers.

The reason for this is that the individual bit signals of the thermometer code are present in parallel at the inputs of the ORings and, consequently, the output signals thereof are coupled into a first adder more or less simultaneously. Since the respective input signals are present in parallel at the multiplexers, too, the corresponding channels of the different multiplexers can be selected more or less simultaneously by means of the fed-back output signals of the first adder. Consequently, directly after the output signals of the first adder are available, the output signals of the second adder and thus the complete binary code are also ready at the output of the converter.

By virtue of the fact that the bits of the thermometer code are processed more or less in parallel, the entire conversion circuit is suitable for very high frequencies in the region of 500 MHz or greater. The conversion circuit can thus advantageously be used in 0.18 μm technologies that are used nowadays. The conversion circuit according to the invention can thus be used for example in applications for wire-free data communication, video applications and broadband applications (e.g. ADSL, VDSL, UMTS, etc.) which are operated at the high frequencies mentioned.

The invention is particularly advantageously suitable for thermometer codes having a very high number of bits, for example a 32-bit or 16-bit thermometer code, since the advantage on account of the very fast conversion speed in comparison with conventional conversion methods or conversion applications is a particularly major advantage here. Furthermore, the invention is, of course, also highly advantageously suited to thermometer codes having a lower number of bits, for example 4-bit or 8-bit thermometer codes. However, the invention shall not be restricted exclusively to 4-bit or 8-bit, 16-bit, 32-bit thermometer codes, but rather can, of course, be extended to any desired number of bits.

Advantageous refinements and developments can be gathered from the subclaims and also the description with reference to the drawing.

In one refinement of the invention, the number of OR gate circuits and/or the number of multiplexer circuits or the number of the input terminals thereof is defined by the thermometer code subdivided into segments.

In one refinement, four bits are provided per segment, the segments of the thermometer code typically having an identical bit width in each case.

In one refinement, in each case only bits of a single segment are coupled into the input terminals of a respective OR gate circuit.

In one refinement, in each case only bits of different segments, which, however, have the same MSB or LSB significance within the respective segment, are coupled into the input terminals of a respective multiplexer circuit.

In one refinement, the least significant segment, that is to say the segment with the first four bits of the thermometer code, is always actively set. This insight can be utilized in order to reduce the circuitry outlay for calculating the number of segments in the adder, in that only the outputs of the OR gates representing the three more significant segments are summed. In the case of m segments, the first number thus amounts to m, in particular m−1.

In a highly advantageous refinement, the least significant bit (LSB) of a respective active segment is always set to "one". This advantageously reduces the circuitry outlay and thus also the computational complexity, since only the three more significant bits of an active segment have to be multiplexed and then added up. In the case of a bit width k of a segment, the second number then amounts to k, in particular k−1.

In one refinement, in the case of m segments having the bit width K=4, the number of input terminals of the adders amounts at most to m, advantageously m−1. For the case m=4, in the latter case, it is advantageously possible for at least one of the adders to be designed as a full adder. A full adder has three inputs and two outputs. The full adder thus adds three bits and provides two bits, and thus four possible output values, at its output. It goes without saying that a half-adder would also be conceivable here, for example in the processing of a thermometer code having a width of only 8 bits.

In a highly advantageous refinement, the adders, the OR gates and/or the multiplexers are designed as standard library cells. These library cells may be taken from a conventional library containing a multiplicity of basic circuits, in particular basic gate circuits. This refinement furthermore makes it possible, in the event of a transition to a new chip technology, for the corresponding converter circuit to be adapted to the new technology in a very simple manner by merely exchanging the standard library cells. An additional outlay for an adapted circuit layout or circuit design is no longer necessary here, so that the development outlay and thus also the development costs remain minimal in the case of a required technology transfer.

In one refinement, the converter has at most n input terminals and at most m output terminals.

The binary output code is typically a binary code or a hexadecimal code.

In a particularly advantageous refinement, the conversion circuit according to the invention dispenses with means that are provided specifically for eliminating errors in the case of transition bit errors. In this case, the invention is based on the insight that such transition bit errors occur extremely rarely and, particularly in the case of thermometer codes having a high number of bits, corrupt the result only to an insignificant extent. Furthermore, in specific cases, an error brought about by a transition bit error is not reflected at all in the binary output code. The reason for this is that, by means of the arrangement according to the invention and the method according to the invention, the bits of specific segments which are not actively identified are not concomitantly taken into account at all in the calculation of the binary code that is output. If the transition bit error falls within such a segment, then the invention opens up the possibility that this error is not taken into account and that consequently, a binary output signal freed of errors is ready. By virtue of the fact that, moreover, the highly extensive circuitry outlay for correcting errors or eliminating errors as is required for example in conversion circuits according to the prior art is dispensed with, the entire circuitry outlay is very low and the performance is correspondingly improved.

The conversion arrangement according to the invention is advantageously used in an analog-to-digital converter, in particular in a parallel analog-to-digital converter or a flash analog-to-digital converter.

BRIEF DESCRIPTION OF THE DRAWINGS

The invention is explained in more detail below using the exemplary embodiments specified in the figures of the drawing, in which:

FIG. 1 shows a table which, on the basis of an example for a 16-bit thermometer code, represents the conversion into a 4-bit binary code by means of the segmentation according to the invention;

FIG. 3 shows a table which is used to represent the conversion of a 16-bit thermometer code into a 4-bit binary code in the case where a transition bit error is present;

Figure 2:
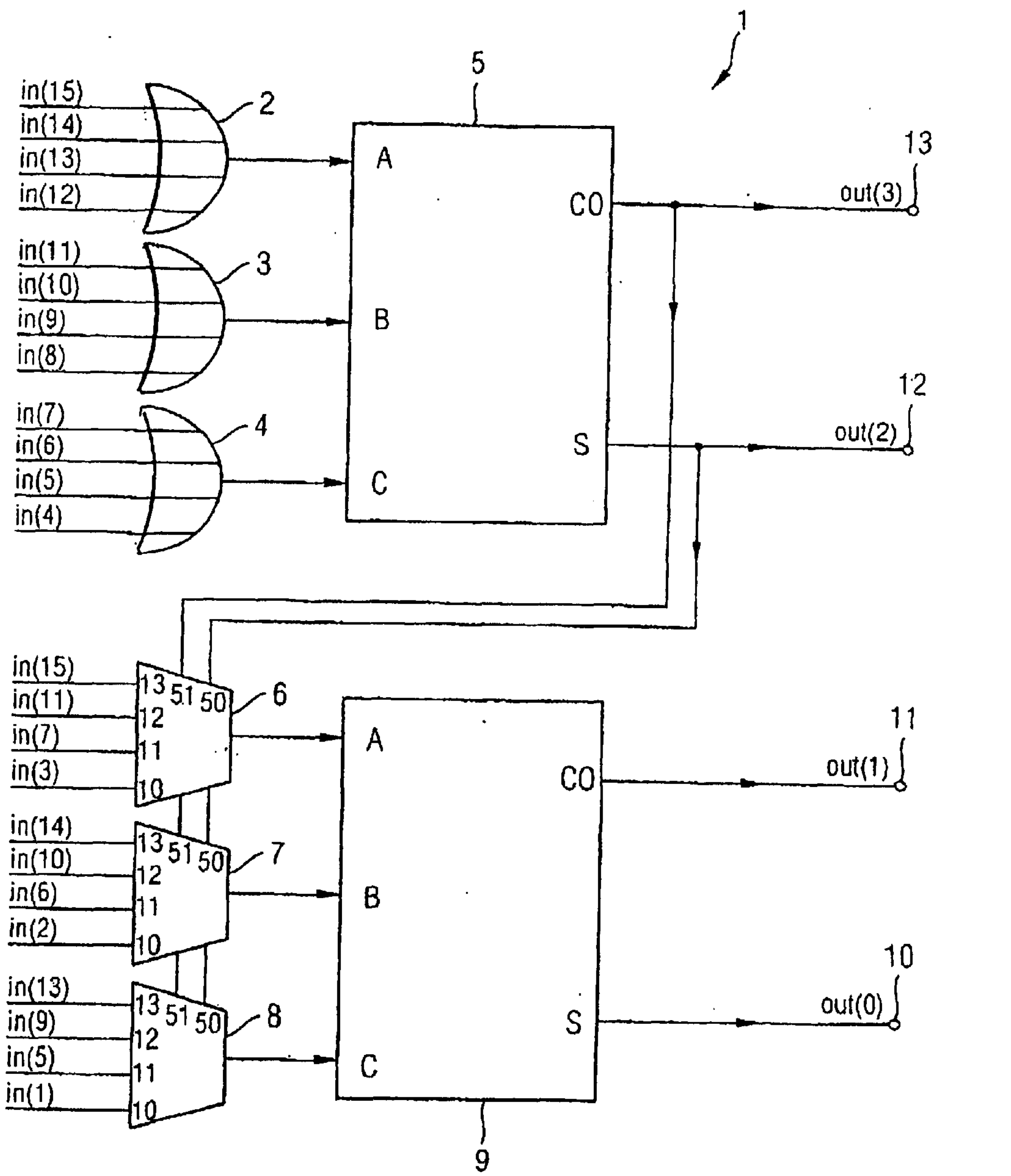
FIG. 2 shows a schematic block diagram for a conversion arrangement according to the invention on the basis of which the conversion method according to the invention is represented.

In all the figures of the drawing, unless specified otherwise, identical or functionally identical elements and signals have been designated identically. The numbers specified in brackets in FIGS. 2 and 4 in each case designate the bit position begun respectively from the least significant bit (LSB). The representation of the bit number begins in each case at zero as the least significant bit (LSB) and, in the case of a 16-bit thermometer code, stops at 15 as the most significant bit (MSB).

DETAILED DESCRIPTION

The table in FIG. 1 shows a complete 16-bit thermometer code, the corresponding binary code and also the corresponding decimal value of the thermometer code or binary code. Furthermore, the last column represents the segment number p of the respectively active segment in binary notation.

The example in FIG. 1 applies to a 4-bit output signal, which thus represents the bit range from 0 to 15. The number of input signals is thus 15, for simplified calculation an additional column having been added which is always set to one and thus contains the least significant bit (LSB) of the thermometer code.

The input thermometer code in FIG. 1 accordingly defines a matrix which has 16 bits in each case both in the vertical and horizontal direction and thus represents a 16×16 matrix.

This 16×16 matrix is now subdivided into a multiplicity of segments having a width of 4 bits, to be precise both in the vertical direction and in the horizontal direction. The 16×16 matrix thus has four column segments and also four row segments. This segmentation has been represented in the table in FIG. 1 by means of corresponding blank rows or blanks between adjacent segments.

The following nomenclature is defined for the further description of the invention:

A bit having the value one is designated as "active bit" below. An active segment is a segment within a thermometer code which has at least one active bit.

In order now to be able to identify whether active bits exist within a segment of a thermometer code, use is made in each case of an ORing with four inputs and an output for each segment. If an active segment is present, then the result of this ORing is one, whereas a zero results in the case of a non-active segment. The various results of the ORings are added and thus produce the number of active segments.

On account of the fact that the least significant segment (LSS), that is to say the segment with the bit number 0 to 3, is always active, an ORing can advantageously be dispensed with here since the result of this combination would always be a one in any case. This additionally reduces the computational complexity, since only three rather than four output bits have to be added up.

As already mentioned above, the thermometer code as well as the binary code in each case has a high regularity. This fact may advantageously be used in the further determination of the binary output code. Thus, the table in FIG. 1 shows that the two MSB bits of the binary output code precisely correspond to the binary segment number (see last column in FIG. 1). Furthermore, the table reveals that the two LSB bits of the binary output code in each case have the same pattern for each vertical segment. The reason for this is that the two LSB bits of the binary output code in each case represent the active segment within the thermometer code in which the bit transition from zero to one is effected.

This insight may be utilized for the multiplexing of the respective bits within this segment, since the segment in which the bit transition takes place is known from the ORing and addition already carried out. Multiplexing thus yields that row of the active bits within the active segment in which the bit transition takes place. Said bits can then be added and form the two LSB bits of the binary output code.

The table in FIG. 1 shows this relationship. FIG. 1 furthermore shows that the LSB bit within said active segment is always set to "one". This insight may be utilized to the effect that only the three MSB bits within the active segment are added in the event of the multiplexing and addition, so that, instead of using 4 multiplexers, it is possible to use just 3. This additionally reduces the computational complexity.

FIG. 2 shows a schematic block diagram for a circuit arrangement for converting a 16-bit thermometer code into a 4-bit binary output code.

In FIG. 2, the converter is designated by reference symbol 1. The converter 1 has four outputs 10–13, at which the binary output code out(0)–out(3) can be tapped off. The converter 1 furthermore has a multiplicity of input terminals, into which the bits of the thermometer code in(0)–in(15) can be coupled.

The converter 1 contains three OR gates 2, 3, 4 arranged in parallel with one another, each OR gate 2, 3, 4 having four inputs and an output. On the output side, a full adder 5 is connected downstream of the OR gates 2, 3, 4. The full adder 5 has three input terminals A, B, C and two output terminals CO, S, a respective input terminal A, B, C being connected to an output of an OR gate 2, 3, 4. The two output signals out(3), out(2), which correspond to the two MSB bits of the binary output signal, are present at the two output terminals CO, S.

The converter 1 furthermore has three multiplexers 6, 7, 8 each having four inputs and an output. The multiplexers 6, 7, 8 furthermore have two selection inputs S0, S1, which are connected to the output terminals CO, S of the full adder 5 and into which the binary output signals out(3), out(2) can thus be coupled. A second full adder 9 is arranged on the output side of the multiplexers 6, 7, 8 arranged in parallel with one another. The second full adder 9 has three inputs A, B, C and two outputs CO, S, the three inputs A, B, C in each case being connected to an output of the multiplexers 6, 7, 8.

The two outputs CO, S of the first full adder 5 equally form the two output terminals 13, 12 at which the two MSB bits of the binary output code are present, whereas the two terminals CO, S of the second full adder 9 form the other two output terminals 11, 10, at which the two LSB bits of the binary output code can be tapped off.

FIG. 2 furthermore reveals that not all 16 bits of the thermometer code in(0)–in(15) are used for the conversion, as already mentioned above. This reduces the entire circuitry outlay in a highly advantageous manner. The conversion circuit 1 in accordance with FIG. 2 is thus suitable for converting a thermometer code in(0)–in(15) corresponding to FIG. 1 into a binary output code out(0)–out(3) in a very simple and rapid manner.

The functioning of the converter 1 shall be briefly explained below:

In order to be able to ascertain how many active segments are present in a respective thermometer code, the bits in(4)–in(15) of the upper three segments (p=1–p=3), that is to say the three MSS segments, are coupled into the three OR gates 2, 3, 4 segment by segment. If a respective segment has at least one active bit, then the ORing causes the output signal to become "one". The number of active segments can then be ascertained. Since an active bit is always present in the lowest segment, such an ORing can be dispensed with since the input bits are present in parallel at the OR gates 2, 3, 4, and the input signals for the first full adder 5 are ready more or less in parallel at the outputs of the OR gates 2, 3, 4. Said full adder merely has to add up these three bits and generate therefrom the two MSB bits of the binary output code out(2), out(3), which are present at the output terminals 12, 13. These output signals out(2), out(3) are then utilized in order to select the respectively desired inputs I0–I3 at the multiplexers 6, 7, 8. The inputs I0–I3 of a respective multiplexer 6, 7, 8 are arranged in such a way that exclusively the highest MSB bits of the four segments are fed to the first multiplexer 6, the second highest MSB bits of the four segments are fed to the second multiplexer 7 and the third highest MSB bits of the four segments are fed to the third multiplexer 8. By means of the two MSB bits of the binary output code which are present at the output terminals 12, 13 and are coupled into the selection terminals S1, S0 of the multiplexers 6, 7, 8, it is possible to select that segment in which the bit transition precisely takes place, i.e. the multiplexers 6, 7, 8 transmit only those input bits which are arranged in the respective active segment with a bit transition. These three output signals of the multiplexers 6, 7, 8 are added up by the second full adder 9, so that the two LSB bits of the binary output code out(0)–out(1) can be tapped off at the output terminals 10, 11.

A fourth multiplexer at whose input terminals the LSB bits of a respective segment are present can be dispensed with, since the LSB bit is always set to "one" and in particular within the segment within which the segment in which the bit transition takes place.

By means of the conversion circuit 1 in accordance with FIG. 2, the binary output code out(0)–out(3) can be obtained from the 16-bit thermometer code in(0)–in(15) very simply and very rapidly. This is because the OR gates 2, 3, 4 and also the multiplexers 6, 7, 8 are in each case arranged in parallel with one another so that their output signals are present more or less simultaneously. In contrast to the prior art, wherein the entire 16 bits have to be added successively in order to obtain the binary output code, here the full adders 5, 9 in each case have to add up only three bits. This is effected very much more rapidly in comparison with the prior art.

FIG. 3 shows a table which is used to represent the conversion of a 16-bit thermometer code into a 4-bit binary code in the case where a transition bit error is present.

The table in FIG. 3 shows that an error caused by a transition bit error in the binary output code cannot be completely prevented by the converter 1 according to the invention in accordance with FIG. 2. It is shown, however, that, without the presence of an error correction circuit specially provided for this purpose, occasionally a transition bit error does not become apparent at all in the binary output code. This can be explained by the fact that not all the bits of the thermometer code are utilized for the conversion.

Figure 4:
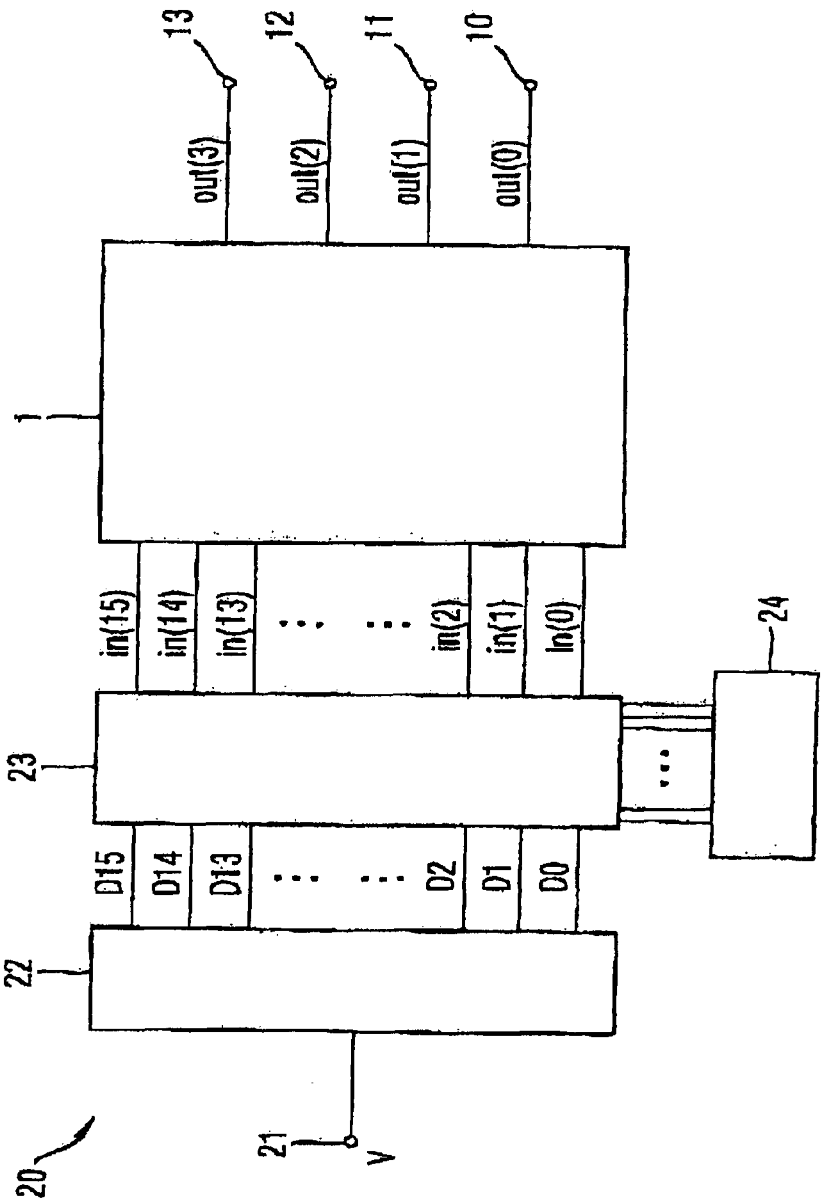
FIG. 4 shows an example of an analog-to-digital converter with a converter arrangement according to the invention in accordance with FIG. 2.

FIG. 4 shows an example of an analog-to-digital converter with a converter arrangement according to the invention in accordance with FIG. 2.

The analog-to-digital converter has been designated by reference symbol 20 here. The analog-to-digital converter 20 has an input 21 and four outputs 10–13, which correspond to the outputs of the converter 1. An analog input signal VI is coupled into the input terminal 21. The analog-to-digital converter 20 has an input stage 22 connected to the input 21, analog partial signals D0–D15 being present at the outputs of said input stage. Connected downstream of the input stage 22 is a reference stage 23 for generating the thermometer code in(0)–in(15). The reference stage 23 is furthermore coupled to a reference voltage source 24 for providing different reference potentials. A conversion circuit 1, the construction of which corresponds, for example to that in FIG. 2, is connected downstream of the reference stage 23 on the output side.

The present invention has been described on the basis of a converter for converting a 16-bit thermometer code into a 4-bit binary output code. However, the invention shall not be restricted to this 16-bit-to-4-bit conversion, but rather can be extended to any desired number of bits of the thermometer code, for example to 32 bits, 8 bits, 4 bits. Reducing the number of bits, for example from 16 to 8, would result in the need for just one OR gate 2, 3, 4. The multiplexers 6, 7, 8 would have only two inputs in this case. Accordingly, in the case of a converter 1 designed for more than 16 bits, it would also be necessary to use a larger number of OR gates 2, 3, 4, in which case the multiplexers 6, 7, 8 would have to be designed for a larger number of inputs.

To summarize, it can thus be stated that the method according to the invention and the arrangement according to the invention can realize a conversion of a thermometer code into a binary output code in a very simple but nevertheless very effective and rapid manner.

The present invention has been represented on the basis of the above description in such a way as to explain the principle of the method according to the invention and the practical application thereof as well as possible, but the invention, given suitable modification, can, of course, be realized in diverse variants.

What is claimed is:

1. An arrangement for converting a binary input signal corresponding to an n-bit thermometer code into a binary output code, the arrangement comprising:

- a first number of OR gate circuits configured to receive bits of the n-bit thermometer code;
- a first adder operably coupled to receive output signals from the first number of OR gates, the first adder operable to provide at an output at least one binary output signal of the binary output code;
- a second number of multiplexer circuits having data inputs configured to receive bits of the thermometer code, the second number of multiplexer circuits further including at least one selection input operably coupled to receive at least one binary output signal from the first adder;
- a second adder operably connected downstream of the multiplexer circuits to receive a multiplexer output therefrom, the second adder operable to provide at an output thereof at least one further binary output signal of the output binary code.

2. The arrangement according to claim 1, wherein the first number of OR gate circuits is defined by a number of inputs of each of the first number of OR gates and the number of bits n in the n-bit thermometer code.

3. The arrangement according to claim 1, wherein the n-bit thermometer code is divided into a plurality of m segments, each segment having an identical bit width k.

4. The arrangement according to claim 3, wherein each of the first number of OR gate circuits is configured to receive only bits of a single segment of the n-bit thermometer code.

5. The arrangement according to claim 4, wherein each of the second number of multiplexer circuits are configured to receive only a single bit from any one segment of the n-bit thermometer code.

6. The arrangement according to claim 3, wherein the first number of OR gate circuits comprises m−1 OR gate circuits.

7. The arrangement according to claim 3, wherein the second number of multiplexer circuits comprises k−1 multiplexer circuits.

8. The arrangement according to claim 3, wherein the first adder is has m−1 inputs and the second adder includes m−1 inputs.

9. The arrangement according to claim 1, wherein at least one of the first adder and the second adder comprises a full adder.

10. The arrangement according to claim 1, wherein each of the adders, the OR gate circuits, and the multiplexer circuits have a circuit construction defined from a standard cell from a digital circuit library.

11. The arrangement according to claim 3, wherein the converter has m output terminals.

12. The arrangement according to claim 1, wherein the binary output code comprises at least one of a binary code and a hexadecimal code.

13. A method for converting a binary input signal corresponding to a thermometer code into a binary output code, the-method comprising:

(a) receiving an n-bit thermometer code;

(b) dividing the n-bit thermometer code into m segments;

(c) performing an OR operation on bits of at least the m−1 more significant segments to generate at least m−1 output signals;

(d) summing the at least m−1 output signals, a binary result from this addition forming a first part of the binary output code;

(e) multiplexing sets of bits of different segments, each set comprising bits having the same MSB significance within their respective segments, wherein the first part of the output code is used as multiplex selection signal;

(f) adding the multiplexed output signals, a binary result from this addition forming a second part of the binary output code.

14. The method according to claim 13, wherein step (c) further comprises performing the OR operation on the bits of only the m−1 more significant segments.

15. The method according to claim 14, wherein the sets of bits of step (e) exclude a least significant bit of each segment.

16. The method according to claim 13, wherein the sets of bits of step (e) exclude a least significant bit of each segment.

17. Method according to claim 13, wherein step (b) further comprises dividing the n-bit thermometer code into m segments, each segment having a bit width k.

18. An analog-to-digital converter, comprising at least one analog input for coupling at least one analog input signal into an input stage, a reference stage connected downstream of the input stage, the reference stage configured to generate a n-bit thermometer code representative of the at least one analog input signal, and at least one converter configured to convert the n-bit thermometer code into a binary output code, each converter comprising, a first number of OR gate circuits configured to receive bits of the n-bit thermometer code, a first adder operably coupled to receive output signals from the first number of OR gates, the first adder operable to provide at an output at least one binary output signal of the binary output code, a second number of multiplexer circuits having data inputs configured to receive bits of the thermometer code, the second number of multiplexer circuits further including at least one selection input operably coupled to receive at least one binary output signal from the first adder, and a second adder operably connected downstream of the multiplexer circuits to receive a multiplexer output therefrom, the second adder operable to provide at an output thereof at least one further binary output signal of the output binary code.

19. The analog-to-digital converter according to claim 18, wherein:

the n-bit thermometer code comprises m segments, each segment having a bit width k, and the first number of OR gate circuits comprises m−1 OR gate circuits.

20. The analog-to-digital converter according to claim 19, wherein the second number of multiplexer circuits comprises k−1 multiplexer circuits.

* * * * *